United States Patent
McClintock et al.

[19]

[11] Patent Number: 5,821,787
[45] Date of Patent: *Oct. 13, 1998

[54] POWER-ON RESET CIRCUIT WITH WELL-DEFINED REASSERTION VOLTAGE

[75] Inventors: Cameron McClintock, Mountain View; Ninh Ngo, San Jose, both of Calif.

[73] Assignee: Altera Corporation, San Jose, Calif.

[*] Notice: The term of this patent shall not extend beyond the expiration date of Pat. No. 5,612,642.

[21] Appl. No.: 726,461

[22] Filed: Oct. 4, 1996

Related U.S. Application Data

[63] Continuation-in-part of Ser. No. 319,381, Oct. 5, 1994, Pat. No. 5,606,276, and Ser. No. 430,923, Apr. 28, 1995, Pat. No. 5,612,642.

[51] Int. Cl.⁶ .................................................. H03K 17/22
[52] U.S. Cl. ........................................... 327/143; 327/198
[58] Field of Search .................................. 327/143, 142, 327/198, 205, 206; 365/226–229

[56] References Cited

U.S. PATENT DOCUMENTS

| | | | |
|---|---|---|---|
| 5,151,614 | 9/1992 | Yamazaki et al. | 327/143 |
| 5,243,233 | 9/1993 | Cliff | 327/143 |
| 5,319,255 | 6/1994 | Garverick et al. | 327/143 |
| 5,498,987 | 3/1996 | Nelson | 327/143 |
| 5,517,144 | 5/1996 | Nakashima | 327/198 |
| 5,534,804 | 7/1996 | Woo | 327/143 |
| 5,612,642 | 3/1997 | McClintock | 327/143 |

FOREIGN PATENT DOCUMENTS

| | | | |
|---|---|---|---|
| 6-164350 | 6/1994 | Japan | 327/143 |

*Primary Examiner*—Timothy P. Callahan
*Assistant Examiner*—Eunja Shin
*Attorney, Agent, or Firm*—Townsend and Townsend and Crew LLP

[57] ABSTRACT

A power-on reset (POR) circuit (200) asserts a POR signal when the supply voltage ($V_{CC}$) is turned on. As the supply voltage increases, the POR signal is deasserted when the supply voltage reaches a voltage ($V_{POR1}$) sufficiently high to make storage elements in a controlled circuit fully operational. The POR signal is kept deasserted until the power supply voltage level drops to a level low enough ($V_{POR2}$) to render the storage elements in the controlled circuit incapable of holding accurate data. The $V_{POR2}$ level that triggers the reassertion of the POR signal is lower than the $V_{POR1}$. Additional circuitry insures that the POR signal is reasserted when $V_{CC}$ drops to the $V_{POR2}$ level by sampling the transistor threshold voltages of the circuit. Another control signal allows the POR signal to be forcibly generated.

25 Claims, 4 Drawing Sheets

POWER-ON RESET CIRCUIT WITH WELL-DEFINED REASSERTION VOLTAGE

BACKGROUND OF THE INVENTION

This invention is a continuation in part of co-assigned U.S. applications Ser. No. 08/319,381, entitled "Method and Apparatus for Creating a Large Delay in a Pulse in a Layout Efficient Manner" filed Oct. 5, 1994, now U.S. Pat. No. 5,606,276, and U.S. patent application Ser. No. 08/430,923, now U.S. Pat. No. 5,612,642 entitled "Power On Reset Circuit with Hysteresis," filed Apr. 28, 1995. This invention relates generally to electronic circuits. More specifically, this invention relates to power-on reset circuits and specifically to a power-on reset circuit that is asserted at different voltage levels, depending on whether or not the circuit has already become operational, and that has a well-defined reassertion voltage.

Power-on reset circuits are commonplace in digital circuit designs. The power-on reset (POR) signal, or merely reset signal, is useful to place the circuit being controlled by the POR signal into a known state after power has first been applied to the circuit. This is especially useful in circuits that use storage elements since the state of a storage element is undefined shortly after power is turned on, thus placing the circuit in an unknown and potentially dangerous state.

An example of a power-on reset circuit is U.S. Pat. No. 5,243,233 by Cliff. Cliff discloses a power-on reset circuit where storage elements such as SRAM cells are formed in an integrated circuit. In order to insure that the reset signal is asserted until the SRAM cells become operational, Cliff uses a representative SRAM cell in the generation of the reset signal. The SRAM cell used in the generation of the power-on reset signal is representative of other SRAM cells fabricated on the same silicon substrate forming the integrated circuit. In other words, the SRAM cell and the power-on reset circuit have the same process characteristics as the rest of the cells in the integrated circuit.

The use of identical process storage elements in the POR circuit allows the Cliff POR circuit to deassert the reset signal just after the SRAM cells in a circuit being controlled by the POR signal are known to be operational. This, in turn, reduces the necessary safety margin incorporated in the generation of a reset signal to insure that storage elements are fully operational before deasserting the reset signal. By reducing the safety margin, the reset signal is deasserted earlier in time and the controlled circuit may begin operation earlier than with other forms of reset signal circuits.

However, as discussed in the above-referenced application, a problem exists with power-on reset circuits such as Cliff and the prior art in that once the circuit has become operational, a slight decrease in the power supply voltage level may cause the power-on reset circuitry to again assert the reset signal even though such assertion may not be necessary. For a digital system, the assertion of the reset signal when it is not absolutely necessary results in an interruption of the performance of the digital circuit and, depending on the application, could be a very undesirable event.

This problem is solved by the circuit described in the '923 application with a circuit that uses SRAM cells and other circuitry to create a power-on reset circuit that has different threshold voltages (referred to in that patent as $V_{POR1}$ and $V_{POR2}$), which determine when the POR signal deasserts during a rising $V_{CC}$ and reasserts when $V_{CC}$ falls below the voltage level $V_{POR2}$.

While use of an SRAM sample bit to determine the point at which the POR should be deasserted and then reasserted has proven effective in most circumstances, as described in the '923 application, it has also proven to have some limitations. Limitations are due to the fact that while the theoretical voltage at which the SRAM configuration bits on the integrated circuit lose data is the same for all bits, including those bits that make up the POR circuit, in actual practice this voltage varies from cell to cell. This can be due to environmental differences such as differences in power supply voltage and amounts of noise that each SRAM cell experiences. These effects are very hard to predict and result in variations in the minimum $V_{CC}$ needed to hold data. In some cases an SRAM cell may hold its data even if $V_{CC}$ drops to zero volts and then rises back to a high voltage. This is due to capacitances holding the state of the sample bits even after the cross-coupled inverts of the RAM cell have stopped conducting. Leaker bias circuits can be added to the POR SRAM as described in the '923 application, but these devices may turn off before they have a chance to completely discharge the capacitance holding the bit's state. Thus, in previous POR circuits it is possible that the SRAM cells in the POR circuit do not lose their data and therefore do not reassert the POR signal while the other configuration SRAM cells elsewhere in the chip have lost data. This results in the device losing its configuration data and malfunctioning without a POR signal ever being asserted, a highly undesirable event. Furthermore, the $V_{CC}$ ramp rate and minimum $V_{CC}$ level reached during a $V_{CC}$ brownout event will influence the noise and $V_{CC}$ that various SRAM bits in the circuit experience, and as a result previous POR circuits are sensitive to failure under certain ramp rate and minimum $V_{CC}$ levels, failure being defined as the POR circuit not generating a POR reset signal even though $V_{CC}$ levels have dipped low enough to cause some SRAM cells in the integrated circuit to lose data.

What is needed is a POR circuit that maintains all the advantages of the circuit described in the '923 application while avoiding the problem of failing to provide a reset signal even when the supply voltage dips below a voltage at which some RAM cells in the operational portions of the integrated circuit fail.

SUMMARY OF THE INVENTION

The present invention provides a power-on reset circuit that insures that a POR signal is generated when the supply voltage ($V_{CC}$) drops below a threshold level. The power-on reset circuit of the present invention generates a reset signal that is asserted when the power supply voltage is increased above zero volts. The reset signal remains asserted until it is determined that the power supply voltage is at a high enough level to make the integrated circuit operational. In a preferred embodiment, the integrated circuit is deemed to be operational when the supply voltage is sufficiently high to support initial inputting, holding, and outputting of data to and from the storage elements in the integrated circuit.

After the supply voltage is determined to be at a level sufficient to render the integrated circuit operational (plus a nominal safety margin), the reset signal is deasserted. The reset signal is kept deasserted until it is determined that the power supply voltage has fallen below a minimum supply voltage required to keep the circuit operational. The voltage needed to maintain circuit operation is less than that needed initially to make the circuit operational.

The present invention in one embodiment uses a circuit that incorporates multiple storage elements for determining when the power supply voltage level is sufficiently high to turn off the POR signal and uses a transistor threshold sampling circuit to determine when power has dipped so low that a POR signal must again be asserted.

One embodiment of the invention includes a circuit for outputting a reset signal in response to a power supply voltage. The circuit includes an output terminal for outputting the reset signal; means coupled to the output terminal and the power supply voltage for asserting the reset signal when the power supply voltage is turned on; means coupled to the output terminal and the power supply voltage for deasserting the reset signal when the power supply voltage attains the first voltage; and means coupled to the output terminal and the power supply voltage for reasserting the reset signal when, subsequent to the power supply voltage obtaining the first voltage, the power supply voltage obtains a second voltage below the first voltage.

Another embodiment of the invention includes a circuit for outputting a reset signal in response to a power supply voltage. The circuit includes an output terminal for outputting the reset signals; a memory cell operable at a write voltage for inputting, holding and outputting an electrical state and further operable at a read voltage for holding and outputting an electrical state; a reference signal used as an input to the memory cell for putting the memory cell in a first electrical state when the power supply voltage is at least the write voltage; a pass gate for decoupling the reference signal from the memory cell after the memory cell has been placed in the first electrical state; and a leakage input signal coupled to the input of the memory cell for placing the memory cell in a second electrical state when the power supply voltage is below the read voltage.

DESCRIPTION OF THE PREFERRED EMBODIMENT

Figure 1:
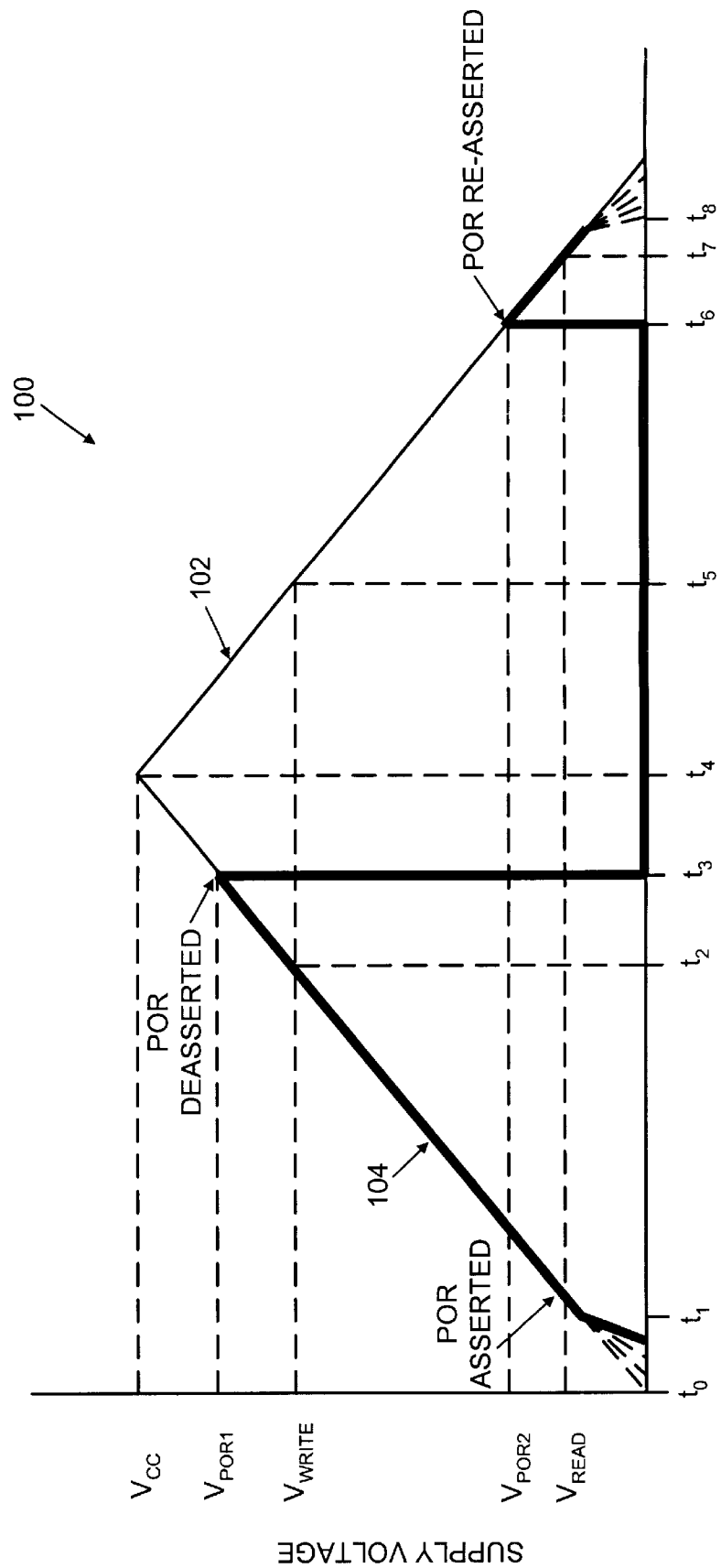
FIG. 1 is a timing diagram showing a power supply voltage waveform and a power-on reset signal.

FIG. 1 is a timing diagram 100 as discussed in the '923 application showing a power supply voltage waveform 102 as a thin line and a power-on reset (POR) signal 104 as a thick line. POR signal 104 is generated according to the present invention by a circuit discussed below. The POR signal is typically applied to a "controlled" circuit and is distributed to storage elements and other components of the controlled circuit to reset the controlled circuit by holding the components in a predetermined state until the POR signal is deasserted. When the POR signal is deasserted the controlled circuit begins its normal operation and continues its normal operation until the POR signal is reasserted. In a preferred embodiment, the POR circuit and the controlled circuit are formed in an integrated circuit on a common substrate by shared fabrication steps.

In FIG. 1, at $t_0$, after the power supply is turned on, the power supply voltage waveform 102 steadily increases to its normal operating voltage $V_{CC}$. In many digital integrated circuits, typical values for $V_{CC}$ may be 3.3, 5.0, or 12 Volts. For purposes of illustration, the timing diagram of FIG. 1 shows power supply voltage waveform 102 decreasing after reaching the normal operating voltage so that the hysteresis effect of the POR reset signal and the reassertion safeguard circuit of the present invention can be discussed.

After turning the power supply on at time $t_0$, but before time $t_1$, the state of the POR circuit is undefined so that the voltage, or signal output, of the POR circuit can be in a range of voltages as shown by the dotted lines between $t_0$ and $t_1$. As the power supply voltage increases it reaches a voltage at $t_1$ that is high enough for the POR circuit to come to a defined state and assert the POR signal. In a specific example, this voltage, where the POR signal is first asserted, is about 0.7 Volts. As the power supply voltage increases the POR signal shown by the thick line 104 closely tracks the power supply voltage waveform 102.

At time $t_2$, the power supply voltage has risen high enough so that storage, or memory, elements in the integrated circuit may be reliably written with data. This voltage is shown as $V_{WRITE}$ on the timing diagram of FIG. 1 and occurs at time $t_2$. The approximate voltage for $V_{WRITE}$ in one specific example is 2.3 Volts.

According to the invention, even after the supply voltage ($V_{CC}$) reaches a level at which the control circuit would be expected to be operational, a POR signal remains reasserted for time $t_2$–$t_3$ so that all elements in the control circuit will have sufficient time to power up to operational levels. At time $t_3$ the POR signal is deasserted and the control circuit is allowed to become operational. Between time $t_3$ and time $t_6$, the controlled circuit is at a fully operational state. In a real circuit the level of $V_{CC}$ will fluctuate due to power supply characteristics and to the switching on and switching off of different circuit elements connected to the power supply. According to the current invention, the POR generating circuit is designed so that fluctuations in $V_{CC}$ do not cause a reassertion of the POR signal until such time as $V_{CC}$ dips a voltage level indicated by $V_{POR2}$, shown at time $t_6$, at which time some elements in the controlled circuit would be expected to fail.

As explained above, while the desired operation of prior art circuits was that the POR signal be reasserted as soon as the supply voltage $V_{CC}$ reached the voltage level $V_{POR2}$, prior art circuits sometimes did not achieve this reassertion because the sample memory cells sometimes did not discharge even when $V_{CC}$ dipped substantially below $V_{POR2}$. Accordingly, the current invention provides additional transistor circuits to insure that the POR signal is reasserted as soon as $V_{CC}$ reaches voltage $V_{POR2}$.

In FIG. 1, power supply voltage waveform 102 continues to decrease after time $t_6$ and the POR signal 104 continues to be asserted and track $V_{CC}$ as the power supply voltage is reduced. At time $t_7$ the power supply voltage is below $V_{READ}$ so that the memory elements and the circuit no longer reliably hold their data. However, since the POR reset signal is being asserted the circuit is not functioning but is in a reset mode which insures that no further errors can be propagated to the electronic system using the integrated circuit. After time $t_8$ the power supply voltage has fallen low enough so that the output of the POR circuit is undefined.

While not shown in FIG. 1, assuming, after time $t_6$ that $V_{CC}$ begins to rise again, the behavior of POR signal 104 would be similar to that between times $t_1$ and $t_3$. That is, POR reset signal 104 would continue to be asserted until the power supply voltage reached the level $V_{POR1}$ at which time the POR reset signal 104 would be deasserted again.

Figure 2:
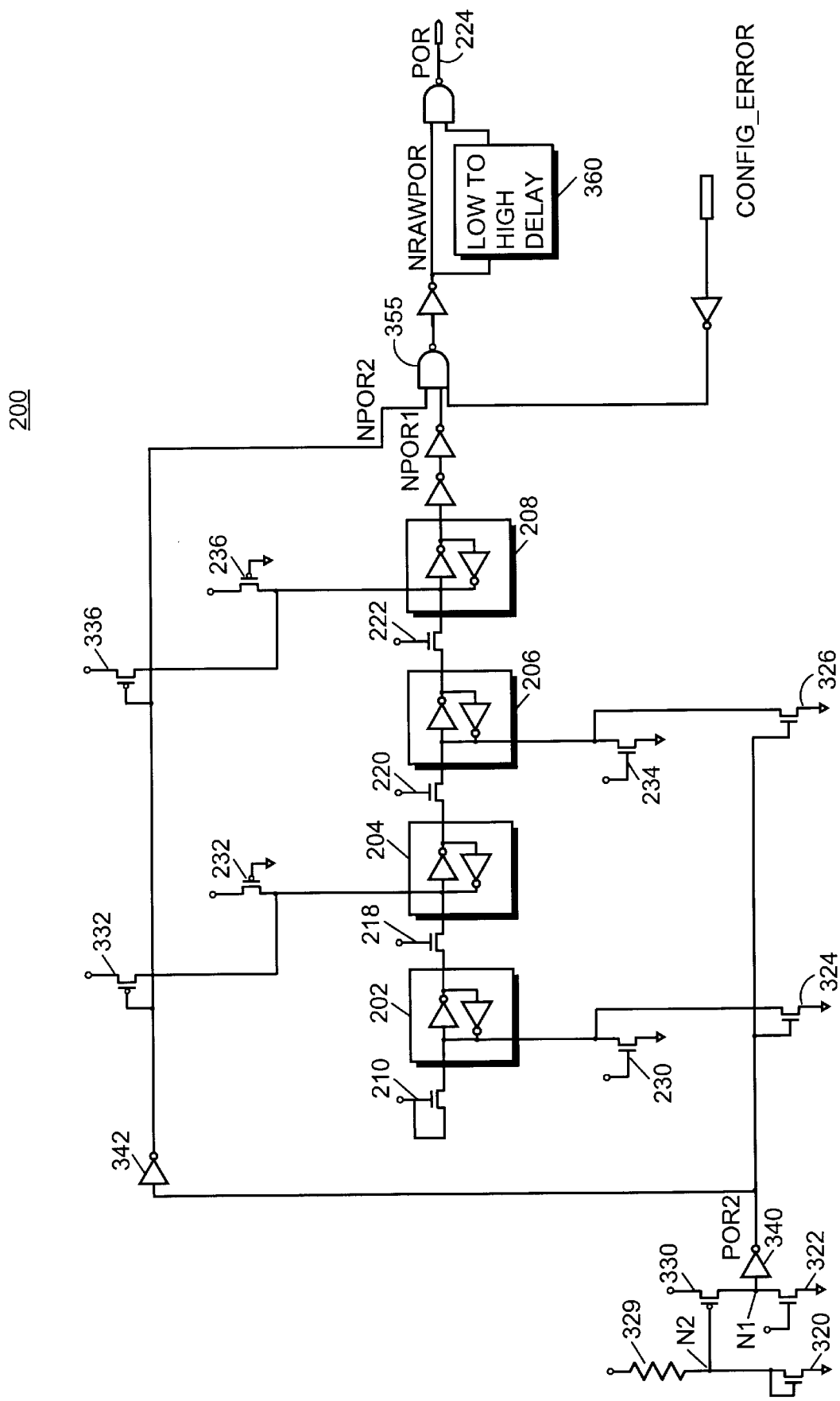
FIG. 2 shows a schematic diagram of a circuit for generating the reset signal of FIG. 1.

FIG. 2 shows a schematic diagram of a circuit for generating the POR reset signal 104 of FIG. 1.

FIG. 2 shows POR circuit 200 including SRAM cells 202, 204, 206 and 208. This circuit uses SRAM cells since the circuit being controlled by POR circuit 200 includes SRAM cells of the same type as the sample storage elements. In the preferred embodiment the SRAM cells and additional components in the POR circuit and the circuit being controlled are fabricated with complimentary metal-oxide-semiconductor (CMOS) technology. Implementations of the present invention are possible in other process technologies, e.g., bipolar, or metal-oxide-semiconductor (MOS). An important aspect of the present invention is that storage elements such as SRAM cells 202–208 used in the POR circuit are formed identically with those storage elements used in the circuit being controlled so that the voltage levels for $V_{WRITE}$ and $V_{READ}$ of the POR circuit SRAM cell track those of the controlled circuit's SRAM cells. The circuit shown in FIG. 2 operates as follows.

When the power supply is first turned on, the power supply voltage begins to climb from zero Volts to its normal operating Voltage of $V_{CC}$. When the power supply voltage is at a very low level, below the gate turn on threshold of a transistor, approximately 0.7 Volts, the output of the POR circuit (as well as all circuits) is undefined. This corresponds to time before $t_1$ and after $t_8$ in FIG. 1. Once the power supply voltage is above the gate turn-on threshold of a transistor, the leaker transistor devices 230, 232, 234 and 236 bias the SRAM cells 202, 204, 206 and 208 into the following states: the input of cell 202 and 206 is low due to the pull-down leaker transistors 230 and 234; the input of cell 204 and 208 is high due to the leaker pull-ups 232 and 236. The outputs of the SRAM cells are the inversion of their inputs. The gate nodes of the transistors 218, 220 and 222 are tied to the power supply voltage. This allows these transistors to pass current between their source and drain nodes allowing them to act as pass gates. These pass gates have a finite "on" resistance which causes a voltage potential drop across their source and drain when passing a voltage signal.

In addition, for the pass transistor to maintain conduction, if the source (drain) is being driven to a high, the drain (source) will drop an additional $V_{TN}$ (the gate turn-on threshold of an N-channel transistor) below the gate voltage. These pass gates connect the SRAM cells 202, 204, 206, and 208 into a chain with the preceding SRAM cell's output driving the successive cell's input through a pass gate. The first SRAM cell, 202, has its input connected to the pull-up transistor 210. This pull-up contends with the pull-down paths of leaker transistor 230. As long as the power supply voltage does not rise high enough for transistor 210 to source enough current to pull the input of SRAM cell 202 high enough to be sensed as a logic "1," the state of each SRAM cell is consistent with the leaker transistors and with the state of its neighboring SRAM cells, and the NPOR1 signal is asserted out of cell 208.

When the power supply voltage has risen sufficiently, transistor 210 will source enough current to pull the input of SRAM cell 202 high enough to be sensed as a logic "1". When this occurs, SRAM cell 202 changes state and its output will drive low. The output of 202 is now contending with the leaker pull-up 232 through the transistor 218. SRAM cell 204 will not change state until the power supply voltage is high enough so that the low driving output of cell 202 and pass gate 218 are strong enough to drive the input of SRAM cell 204 low enough to be sensed as a logic "0". When this occurs, SRAM cell 204 is written with a logic "0." Note that similarly designed SRAM cells elsewhere in the circuit being controlled by the POR signal will also be operational with respect to their ability to write a logic "0" into neighboring SRAM cells. The additional pull-up current of leaker transistors such as 232 within the POR circuit of FIG. 2, which is not present in SRAM cells outside the POR circuit, insures that a slightly higher power supply voltage is needed for writing into SRAM cells within the POR circuit, such as SRAM cell 204, than is needed for SRAM cells in the controlled circuit. This provides a safety margin in that the POR signal will not be deasserted until the power supply voltage is high enough so that SRAM cells in the controlled circuit can be written.

Since SRAM cell 204 is now written with a logic "0" at it's input, it's output will drive high, contending with the leaker pull down 234 through transistor 220. When the supply voltage equals $V_{POR1}$, approximately 2.7 Volts, the output of SRAM cell 204 and pass gate 220 will be strong enough to drive the input of SRAM cell 206 high enough to be sensed as a logic "1". When this occurs, SRAM cell 206 is written with a logic "1." This insures that similarly designed SRAM cells elsewhere in the controlled circuit are now operational with respect to writing a logic "1" into neighboring SRAM cells. The additional pull-down current of leaker 234, which is not in SRAM cells outside the POR circuit, insures that the power supply voltage needed for writing a logic "1" into SRAM cell 206 is approximately 0.4 Volts higher than is needed in SRAM cells outside the POR circuit. The voltage needed to write a logic "1" into non-POR SRAM cells equals $V_{WRITE}$ and is approximately 2.3 Volts. Because writing a logic "0" into an SRAM cell involves no $V_{TN}$ drop across the pass gate source and drain, the writing of a "0" usually occurs at a lower voltage than the writing of a "1". This would be reversed if the pass gates were formed with P-channel transistors.

The output of SRAM cell 206 is now driving low. Since the power supply voltage is high enough to allow a "0" to be written into a POR SRAM cell, cell 208 senses its input as a logic "0" and changes state, driving a logic "1" at its output.

The SRAM cell 202 and transistor 210 serve to initiate the change in state of the SRAM cell chain. In addition, SRAM 202, if the leaker is neglected, provides the same input impedance to SRAM 204 as is seen by SRAM inputs of all other cells outside the POR circuit. This insures that (again neglecting the leaker transistors which have negligible effect) SRAM cell 204 behaves identically to the SRAM cells outside the POR circuit. Similarly, SRAM cell 208 provides an output impedance for cell 206 that matches that seen by all other SRAM cells outside the POR circuit. The presence of the leaker transistors is designed to insure that $V_{POR1}$ is larger than $V_{WRITE}$. SRAM 204 insures that a "0" can be reliably written and SRAM 206 insures that a "1" can be reliably written.

With the POR signal deasserted and pass gates 218, 220 and 222 off, the SRAM cells remain in the same state they were in just prior to POR deasserting: SRAM 202 and 206 inputs are logic "1"; SRAM 204 and 208 inputs are logic "0". The leaker devices are acting in opposition to these states of the SRAMs but they have very little current drive capability and the feedback inverter of the SRAM cells overdrive them as long as the power supply voltage is above $V_{POR2}$. If the power supply voltage now drops below $V_{POR1}$ the POR signal is not reasserted. The voltage needed to retain and read data from an SRAM cell, both in the POR and outside the POR, is much lower than that needed for writing into the SRAM.

In the '923 circuit, one of the intended purposes of the leaker transistors was to insure that the power supply voltage at which the POR SRAM cells first lose their ability to retain their state and their ability to be read, $V_{POR2}$, is higher than that of the SRAM cells outside the POR, $V_{READ}$, equal to about 0.8 Volts. As soon as any one or more of the four SRAM cells in the POR changes state, the '923 NAND gate output changes to a logic "1" and the POR signal is reasserted. Once the POR signal is reasserted, the gate voltage of the pass gate transistors, 216, 218, 220 and 222 becomes a logic "1" equal to the power supply voltage. This turns these pass gates on and, once again, the supply voltage must reach $V_{POR1}$ before the POR signal is deasserted. As explained above, however, the RAM cells may be held at their active state even when the voltage has dipped below the $V_{POR2}$ levels due to capacitances on the RAM cell nodes.

Accordingly, the present invention includes additional circuitry to insure that before $V_{CC}$ reaches a level where any of the SRAM bits are near data corruption levels the POR signal is reasserted by the reassert signal NPOR2. Data corruption will generally occur when $V_{CC}$ drops to a level equal to the maximum voltage of either the threshold voltage of n-channel transistors on the integrated circuit ($V_{TN}$) or the threshold voltage of the p-channel transistors ($|V_{TP}|$). This is accomplished with a reset circuit composed of n-channel transistors 320 and 322, p-channel transistor 330 and resistance 329. These devices sense when $V_{CC}$ falls below $V_{TN}+|V_{TP}|$ and reassert the POR signal by signal NPOR2 directly asserting POR through gate 355 and resetting the SRAM bits in the POR circuit into their POR asserted state and conditioning the POR output through the NAND gate 355. The level of the reset circuit can be adjusted to any combination of $V_{TN}$ and $|V_{TP}|$ by adding or removing devices in series with transistor 320 and 330. The reassert signal is communicated to the reset signal via inverters 340 and 342 and is communicated to the representative memory cells through transistors 324, 326, 332 and 336.

The operation of transistors 320, 322 and 330 may be understood as follows. Transistor 322 operates to turn on as soon as $V_{CC}$ equals $V_{TN}$. This forces the node labeled N1 to zero causing the signal POR2 to be active. When the voltage first comes on, transistor 330 will not be on because resistor 329 effectively holds the gate to source voltage of 330 at 0 when power is first supplied. Node N2, therefore, will follow $V_{CC}$ until $V_{CC}$ equals $V_{TN}$ at which time transistor 320 begins conducting. Once $V_{CC}$ is at $V_{TN}$ plus $|V_{TP}|$, transistor 330 begins conducting. Transistor 330 is designed to have a higher driving capacity than transistor 322 which, therefore, forces node N1 high causing POR2 to become inactive. When $V_{CC}$ begins to fall, the reverse operation takes place. Transistor 330 shuts off first at a voltage determined by $V_{TN}$ plus $|V_{TP}|$. Transistor 322 again is conducting forcing node N1 to ground and forcing signal POR2 active.

Low to high delay block 360 may be used to "stretch" the POR signal to insure that the signal is long enough to cause a reset of all elements in the control circuit. This block may be implemented using the techniques disclosed in Patent Application '319 entitled "Method and Apparatus for Creating a Large Delay in a Pulse in a Layout Efficient Manner" which is incorporated herein by reference.

In a variation to the preferred embodiment, the controlled circuit may configure the POR circuit with control signal CONFIG_ERROR. In this embodiment, NAND gate 355 is expanded into a 3-input NAND gate and control signal CONFIG_ERROR is used by the controlled circuit to force a POR reset by causing the POR signal to be asserted whenever the CONFIG_ERROR signal is high. This is useful where the controlled circuit needs to initiate a power-on reset of itself.

Figure 3:
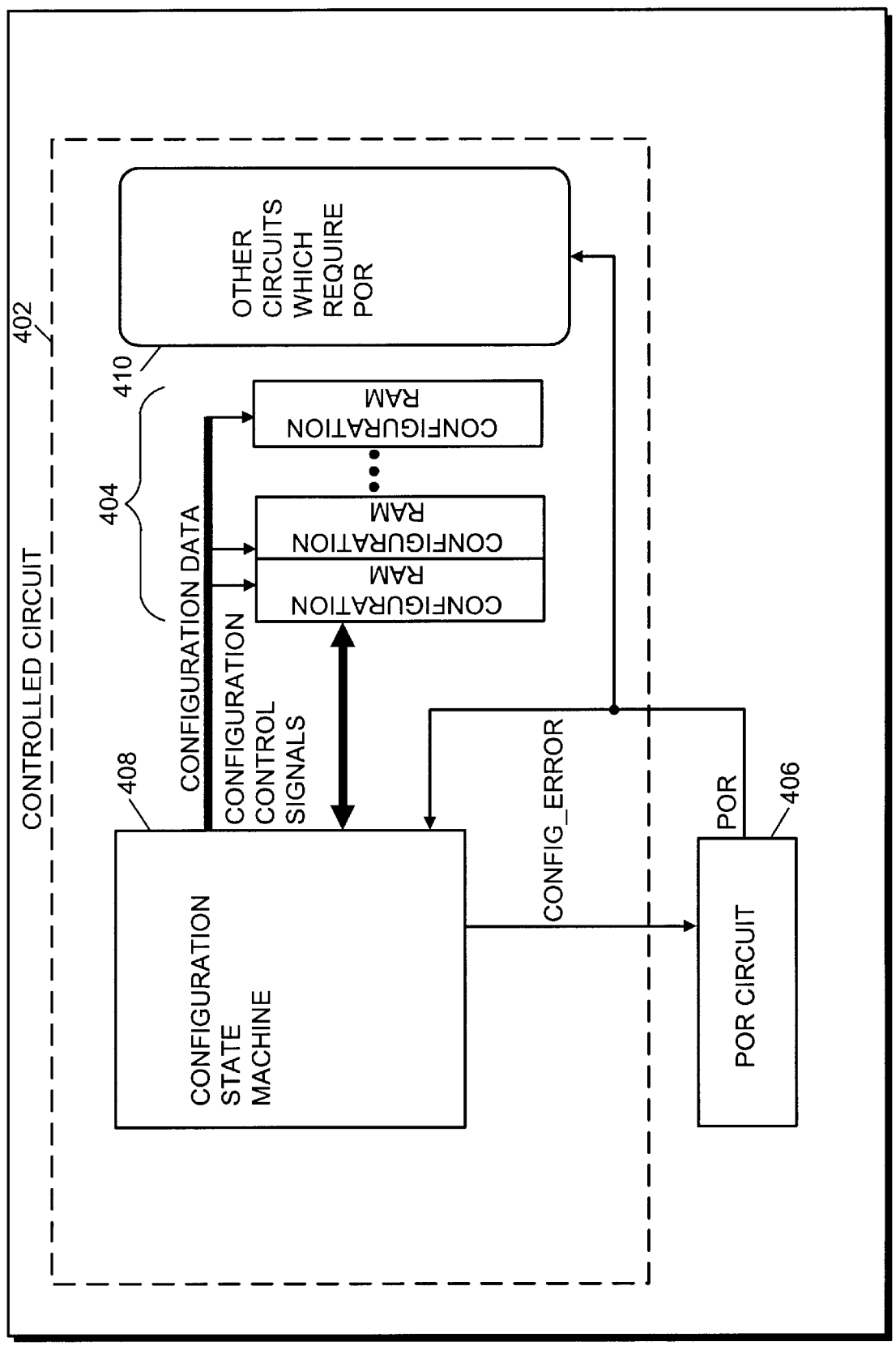
FIG. 3 shows a block diagram of a power-on reset circuit connected to a controlled circuit.

FIG. 3 shows a block diagram of the POR circuit connected to a controlled circuit, including the optional CONFIG_ERROR signal. In FIG. 3, controlled circuit 402 includes RAM cells having electrical properties with respect to the power supply voltage that are as close as possible to the electrical properties of RAM (or, e.g., SRAM) cells used in POR circuit 406. Configuration state machine circuitry 408 communicates with RAM cells 404, receives the POR signal, and generates a CONFIG_ERROR control signal. The POR signal is also distributed to other circuitry, as needed, shown at block 410.

In operation, data is written to and read from RAM cells 404 by configuration state machine 408. Configuration state machine 408 is merely representative of any circuitry that communicates with storage elements such as RAM cells 404. Configuration state machine 408 generates control signal CONFIG_ERROR to force a reset of the circuit. The block diagram of FIG. 3 represents only of one of many possible circuit arrangements that can be used with the POR circuit of the present invention. In a preferred embodiment, the configuration RAM 404 and POR circuit 406 are manufactured on the same silicon or other circuit substrate using the same processes. In that way, the threshold voltages and tolerances of the POR circuit elements will be more nearly identical to those of the configuration RAM 404.

Figure 4:
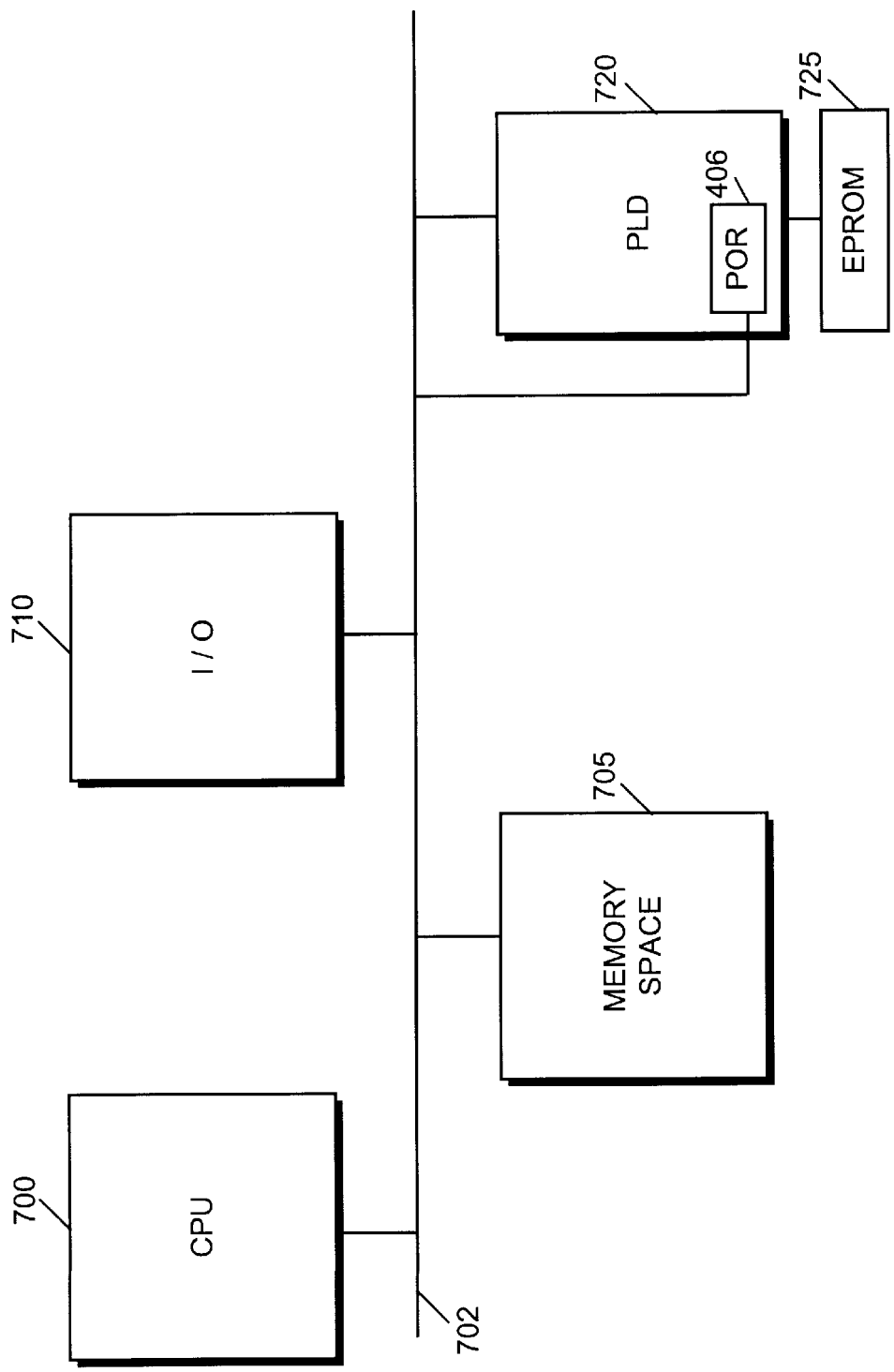
FIG. 4 is a block diagram of a digital processing system incorporating a programmable logic device that includes a power-on reset signal according to the invention.

FIG. 4 shows a simple block diagram of an exemplary digital system in which the present invention may be embodied. FIG. 4 shows a representative system including a central processing unit (CPU) 700 coupled via a bus 702 to a memory space 705 and an I/O 710. Also coupled to the bus 702 is a programmable logic device (PLD) 720 which may perform a wide variety of logic functions. The system shown in FIG. 5 is representative of a very wide variety of computing systems, with very different architecture, performing any digital or partly digital function whatsoever. The exemplary components shown may be interconnected in a wide variety of ways, including a number of different busses or private connections. Alternatively, some components may be incorporated together into single integrated circuits.

It will be understood in the art that the system shown in FIG. 4 may be accurately representative of far more complex systems, with each of the components shown representative of a large collection of components interconnected in a variety of ways, but essentially all sharing digital information over connections in order to perform a digital function. Accordingly, processing unit 700 may be a processing unit of any known type including a microprocessor, floating point coprocessor, graphics coprocessor, or any type of digital controller. Processing unit 700 may also be a PLD programmed for use as a controller or microprocessor and in that case there may only be one PLD in the system.

As is known in the art, executable code may be stored in memory 705 and executed by processing unit 700. Memory space 705 may be a random access memory (RAM), read only memory (ROM), disk, tape, or any combination of known computer data storage means. Processing unit 700 uses I/O 710 to provide an input and output path for user interaction or for other data communication outside of the system.

The system shown in FIG. 4 includes PLD 720. It will be understood in the art that the nature of a PLD is to be able to perform a very wide variety of computational functions depending on its inherent circuitry and configuration data. Accordingly, PLD may serve many different purposes within the system in FIG. 5. PLD 720 may be a logical building block of processing unit 700, supporting its internal and external operations. PLD 720 is programmed to implement the logical functions necessary to carry on its particular role in system operation.

As some examples of the multitude of uses for PLD 720, processing unit 700 may use PLD 720, through bus 702 or a separate connection, to decode memory or port addresses for accessing memory 705 or I/O 710. PLD 720 may be programmed to store data like a memory or specialized memory, where this comes from processing unit 700 or memory 705. PLD 720 may be used as a microcontroller for a memory 705 device such as a fixed or flexible disk drive. PLD 720 may also be configured to be a microcontroller for an I/O 710 device such as a keyboard or scanner. PLD 720 may also be used as a controller or specialized processing unit for performing mathematical, graphical or other calculations, or for telecommunications applications.

The system shown in FIG. 4 may also be used for programming PLD 720 with a particular logic pattern. A computer program for designing functions into a PLD may be stored in memory 705 and executed using processing unit 700. Then, a design characteristic which is to be programmed into PLD 720 is input via I/O 710 and processed by processing unit 700. In the end, processing unit 700 transfers and programs the design characteristic into PLD 720.

Regardless of its use, PLD 720 will generally be configured to perform a desired function by storing configuration data in storage circuits included in the PLD. This configuration data may be loaded into PLD 720 during system operation at power up from memory space 705, from an I/O connection 710, or from a dedicated memory (such as optional EPROM 725) connected to the PLD. In any case, once the configuration data is loaded onto PLD 720, the data must remain there and stay valid for PLD 720 to operate properly. Alternatively, PLD 720 may be semipermanently programmed with nonvolatile configuration data in a system similar to that shown in FIG. 4 before the PLD is removed for use in another environment.

Many other variations to the preferred embodiment are possible. As discussed, the POR circuit may be implemented in a variety of process technologies such as CMOS, bipolar, etc. Further, the specific voltage values of $V_{READ}$, $V_{POR1}$, $V_{WRITE}$, $V_{POR2}$ and $V_{CC}$, and other voltages in the circuits, may vary from those discussed herein. The safety margins may also be varied, as desired. Other modifications will be apparent.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense, the invention being limited only by the provided claims.

What is claimed is:

1. A circuit for outputting a reset signal in response to a power supply voltage, the circuit comprising:
   an output terminal for outputting the reset signal;
   a first memory cell having an input and an output, wherein the first memory cell input is coupled to the power supply voltage;
   a second memory cell having an input and an output, wherein the output of the first memory cell is coupled to the input of said second memory cell;
   a voltage supply coupled to the input of the first memory cell for placing the first memory cell in a first electrical state when the power supply voltage reaches a first voltage level; and
   leakage circuits coupled to the inputs of the memory cells;
   wherein the output terminal is operationally coupled to the output of the second memory cell so that the reset signal is generated according to the electrical state of the memory cells.

2. The circuit of claim 1, further comprising:
   third and fourth memory cells each having an input and an output, wherein the output of the second memory cell is coupled to the input of the third memory cell, wherein the output of the third memory cell is coupled to the input of the fourth memory cell, and wherein the output terminal is operationally coupled to the output of the fourth memory cell so that the reset signal is generated according to the electrical state of the memory cells.

3. The circuit of claim 2, wherein the output of the fourth memory cell deasserts the reset signal when the outputs of the first, second, third and fourth memory cells are, respectively, low, high, low and high.

4. The circuit of claim 3, wherein the circuit is formed in an integrated circuit using CMOS technology.

5. The circuit of claim 4, wherein the memory cells are SRAM.

6. The circuit of claim 1, wherein said reset circuit resets a controlled circuit including control circuit memory cells and wherein said first and second memory cells are fabricated on the same integrated circuit substrate as said control circuit memory cells.

7. The circuit of claim 1, wherein said reset signal is input into a long pulse generator, said long pulse generator generating a long pulse reset signal for resetting a controlled circuit.

8. The circuit of claim 1, further comprising circuitry for reasserting said reset signal when said supply voltage drops to a predetermined level, said reassert circuitry comprising a first transistor and a second transistor and generating a reassert signal when the supply voltage falls below a voltage level that is the sum of the threshold voltages of said first and second transistors.

9. The circuit of claim 8 wherein said reassert signal is coupled to the inputs of said first and second memory cells and forces said first and second memory cells to a state where said reset signal will be asserted.

10. The circuit of claim 8, wherein said reassert level may be adjusted by placing additional transistors in series with said first transistor or said second transistor.

11. The circuit of claim 8, wherein said transistors are formed on the same integrated circuit as the controlled circuit.

12. A circuit for outputting a reset signal in response to a rising and falling power supply voltage, the circuit comprising:
   an output terminal for outputting the reset signal;
   a first memory cell having an input and an output, wherein the first memory cell input is coupled to the power supply voltage;
   a second memory cell having an input and an output, wherein the output of the first memory cell is coupled to the input of the second memory cell;
   a voltage supply coupled to the input of the first memory cell for placing the first memory cell in a first electrical state when the power supply voltage reaches a first voltage level;
   leakage circuits coupled to the inputs of the memory cells; and reassert circuitry for reasserting said reset signal when said supply voltage drops from a normal operating range to a predetermined level, said reassert circuitry comprising a first transistor, said first transistor being diode-connected between a resistance connected to said power supply and ground and providing a gate voltage for a second transistor, said second transistor being connected between said power supply and a third transistor such that the voltage at a node between said second transistor and said third transistor is pulled to zero volts thereby generating a reassert signal when the power supply voltage dips below said predetermined level, said predetermined level approximately equal to the sum of the threshold voltage of said first transistor and said second transistor;

wherein the output terminal and the reassert signal are operationally combined and coupled to the output of the second memory cell so that the reset signal is generated according to the electrical state of the memory cells and according to the reassert signal.

13. The circuit of claim 12, wherein said reset signal is input into a long pulse generator, said long pulse generator generating a long pulse reset signal for resetting a controlled circuit.

14. The circuit of claim 12 wherein said reassert signal is coupled to the inputs of said first and second memory cells and forces said first and second memory cells to a state where said reset signal will be asserted.

15. The circuit of claim 12, wherein said predetermined level may be adjusted by placing additional transistors in series with said first transistor or said second transistor.

16. A circuit for outputting a reset signal in response to a rising and falling power supply voltage, the circuit comprising:

an output terminal for outputting the reset signal;

a plurality of memory cells connected in series, each having an input and an output, wherein the output of one cell is connected to the input of the next cell, said plurality including a first memory cell having an input coupled to the power supply voltage and including a last memory cell having an output coupled to said reset signal output terminal;

voltage supply coupled to the input of the first memory cell for placing the first memory cell in a first electrical state when the power supply voltage reaches a first voltage level; and leakage circuits coupled to the inputs of the memory cells;

reassert circuitry for reasserting said reset signal when said supply voltage drops from a normal operating range to a second voltage level, said reassert circuitry comprising a first transistor, said first transistor being diode connected between a resistor connected to said power supply and ground and providing a gate voltage for a second transistor, said second transistor being connected between said power supply and a third transistor, said third transistor connected to ground with its gate coupled to said power supply, such that the voltage at a node between said second transistor and said third transistor is pulled to zero volts thereby generating a reassert signal when the power supply voltage dips below said second voltage level, said second voltage level approximately equal to the sum of the threshold voltage of said first transistor and said second transistor;

wherein the output terminal is coupled to the reassert signal and to the output of the last memory cell so that the reset signal is generated according to the electrical state of the memory cells and the reassert signal; and memory cell reassert circuits coupled to the inputs of the memory cells and with their gates coupled to the reassert voltage for returning the memory cells to the reset state when said reassert signal is asserted.

17. The circuit of claim 15, wherein said first voltage level is related to the power supply voltage needed for memory cells in said reset circuit and in a controlled circuit to correctly write data and the second voltage level is related to the power supply voltage needed for memory cells in said reset circuit and in said controlled circuit to accurately hold and read data.

18. A method of operating a power-on reset circuit in an integrated circuit comprising the steps of:

asserting a power-on reset signal when power is supplied to said power-on reset circuit;

deasserting the power-on reset signal when a power supply voltage reaches a first voltage level based on the state of a plurality of sampled memory cells; and again asserting said power-on reset signal when said power supply voltage reaches a second voltage level, said second voltage level being below said first voltage level based on the state determined by the threshold voltage of representative transistors in said integrated circuit.

19. The method recited in claim 18 wherein the step of asserting a power-on reset signal when said power is supplied to said power-on reset circuit comprises the step of:

coupling an input of a first memory element to the first voltage level, said first voltage level setting an output of the first memory element to a first output level, said output of the first memory element coupled to and asserting said power-on reset signal.

20. The method as recited in claim 19 wherein said step of deasserting comprises the step of:

coupling said input of the first memory element to the second voltage level with a drive strength of said second voltage level greater than a drive strength of said first voltage level.

21. The method as recited in claim 19 wherein said first voltage level is supplied from a transistor with its gate coupled to a power supply.

22. The method as recited in claim 19 wherein said second voltage level is supplied from a pass transistor coupled to a power supply.

23. A method of operating a power-on reset circuit in an integrated circuit comprising the steps of:

asserting a power-on reset signal when power is supplied to said power-on reset circuit;

deasserting the power-on reset signal when a power supply voltage reaches a first voltage level said deasserting determined by the state of a plurality of memory cells representative of memory cells in a controlled circuit;

reasserting said power-on reset signal when said power supply voltage reaches a second voltage level, said second voltage level below said first voltage level, said reasserting determined by the state of a plurality of memory cells representative of memory cells in a controlled circuit;

wherein the step of asserting and deasserting a power-on reset signal when said power is supplied to said power-on reset circuit comprises the step of:

coupling an input of a first representative memory element to a voltage of said power supply input setting an output of the first memory element to a first output level, an output of said first memory element connected to a plurality of representative memory elements connected in series with an output of each memory element but a last memory element connected to the input of the next memory element, said output of the last memory element coupled to and asserting and deasserting said power-on reset signal; and wherein the step of reasserting a power-on reset signal when said power drops below a second voltage level is comprised of:

coupling a first transistor between said power supply and ground to supply a gate voltage to a second transistor coupled between said power supply and a third transistor coupled to ground and using the voltage level of the connection between the second and third transistors to generate a reassert signal.

24. The circuit of claim 1 wherein said first and said second memory cells are the same type of memory cells as memory cells in a circuit controlled by said circuit for outputting a reset signal.

25. The circuit of claim 1 wherein said leakage circuits coupled to the inputs of said memory cells comprise transistors each having a gate coupled to alternate ones of either a power supply and ground, and a source or drain coupled to alternate ones of a power supply and ground.

* * * * *